(12) United States Patent
Aoki et al.

(10) Patent No.: US 12,463,068 B2
(45) Date of Patent: Nov. 4, 2025

(54) SHEET RELEASE APPARATUS

(71) Applicant: TOKYO SEIMITSU CO., LTD., Hachioji (JP)

(72) Inventors: Hitoshi Aoki, Hachioji (JP); Kiyotaka Kizaki, Hachioji (JP); Yuki Morita, Hachioji (JP); Ryosuke Sumiya, Hachioji (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 18/694,754

(22) PCT Filed: May 24, 2022

(86) PCT No.: PCT/JP2022/021178
§ 371 (c)(1),
(2) Date: Mar. 22, 2024

(87) PCT Pub. No.: WO2023/053570
PCT Pub. Date: Apr. 6, 2023

(65) Prior Publication Data
US 2024/0404847 A1    Dec. 5, 2024

(30) Foreign Application Priority Data
Sep. 28, 2021 (JP) .................................. 2021-158329

(51) Int. Cl.
*H01L 21/67* (2006.01)
*H01L 21/683* (2006.01)

(52) U.S. Cl.
CPC .... *H01L 21/67132* (2013.01); *H01L 21/6836* (2013.01); *H01L 2221/68381* (2013.01)

(58) Field of Classification Search
CPC . B29C 65/18; B29C 65/2015; B29C 65/2023; B29C 65/203; H01L 2221/68386; H01L 2221/68395
See application file for complete search history.

(56) References Cited

U.S. PATENT DOCUMENTS 2,999,042 A * 9/1961 Meister .............. B65D 88/1612
156/203
3,303,084 A * 2/1967 Trzeciak ................. B29C 66/80
219/243

(Continued)

FOREIGN PATENT DOCUMENTS

JP    H1116862    1/1999
JP    3220900 U    4/2019

(Continued)

OTHER PUBLICATIONS

International Search Report, PCT/JP2022/021178, dated Jul. 12, 2022, 2 pages.

(Continued)

*Primary Examiner* — Jason L Vaughan
(74) *Attorney, Agent, or Firm* — Fattibene and Fattibene LLC; Paul A. Fattibene

(57) ABSTRACT

A sheet release apparatus that stably releases a protective sheet from an adherend without damaging the adherend. A sheet release apparatus includes a conveyance table that is movable in a predetermined movement direction with an adherend held therein and a heat stamp that bonds a release tape to a protective sheet, in which the heat stamp includes a plurality of stamp heads that each contact the release tape to press the release tape toward the protective sheet.

15 Claims, 7 Drawing Sheets

(56) References Cited

U.S. PATENT DOCUMENTS

| | | | | |
|---|---|---|---|---|
| 3,530,023 | A | * | 9/1970 | Roberts, Jr. ............. B29C 66/71 156/290 |
| 4,398,986 | A | * | 8/1983 | Smith, Jr. ............. B29C 65/305 156/290 |
| 4,794,030 | A | * | 12/1988 | Celia ................... B29C 66/452 428/173 |
| 6,162,314 | A | * | 12/2000 | Kassuelke ............... B29C 70/46 156/266 |
| 6,919,284 | B2 | * | 7/2005 | Yamamoto ........ H01L 21/67132 438/692 |
| 2003/0230387 | A1 | * | 12/2003 | Smith ................... B29C 66/80 156/581 |
| 2011/0268371 | A1 | * | 11/2011 | Kristal ............. B29C 66/30621 156/583.1 |
| 2015/0367622 | A1 | * | 12/2015 | Adachi ................ B32B 37/187 156/759 |
| 2016/0347047 | A1 | * | 12/2016 | Eguchi ................. B32B 43/006 |
| 2020/0227292 | A1 | * | 7/2020 | Ito ..................... H01L 21/67132 |

FOREIGN PATENT DOCUMENTS

| | | |
|---|---|---|
| JP | 2019192803 | 10/2019 |
| JP | 2021089950 | 6/2021 |
| KR | 20190124634 | 11/2019 |

OTHER PUBLICATIONS

International Preliminary Report on Patentability, PCT/JP2022/021178 dated Sep. 19, 2023, 3 pages.

Notice of Preliminary Rejection in counterpart Korean application No. 10-2024-7008531, Dispatch Date Feb. 6, 2025; with English translation; 11 pages.

Notice of Final Rejection in counterpart Korean application No. 10-2024-7008531, Dispatch Date May 26, 2025; with English translation; 7 pages.

* cited by examiner

SHEET RELEASE APPARATUS

TECHNICAL FIELD

The present invention relates to a sheet release apparatus that releases a protective sheet affixed to an adherend.

BACKGROUND ART

In a semiconductor manufacturing field, there is a process for grinding and thinning a rear surface of a semiconductor substrate such as a silicon wafer (hereinafter referred to as an "adherend"). In the process, a protective sheet composed of an adhesive film or the like is affixed to a front surface of the adherend, to protect a device formed on the front surface of the adherend.

As a sheet release apparatus that releases the protective sheet affixed to the adherend, there has been known an apparatus that releases a protective sheet affixed to an adherend from the adherend upon exertion of a release force on a release tape by bonding the release tape to an end portion of the protective sheet and moving the adherend relative to the release tape (see, e.g., Patent Literature 1).

CITATION LIST

Patent Literature

Patent Literature 1: Japanese Patent Laid-Open No. 11-16862

SUMMARY OF INVENTION

Technical Problem

However, in the apparatus described in Patent Literature 1, when the release tape is bonded to the protective sheet in a large area, an adhesive force between the release tape and the protective sheet may excessively increase. When the release tape pulls the protective sheet upward to release the protective sheet from the adherend, the adherend may greatly spring up to follow the protective sheet. Accordingly, the adherend may be damaged, for example, cracked.

On the other hand, when the release tape contacts the protective sheet in a small area, a tension to be exerted on the protective sheet by the release tape is larger than the adhesive force between the release tape and the protective sheet. Accordingly, the release tape may come off the protective sheet.

Therefore, there occurs a technical problem to be solved to stably release a protective sheet from an adherend without damaging the adherend, and the present invention has its object to solve this problem.

Solution to Problem

To attain the above-described object, a sheet release apparatus according to the present invention is a sheet release apparatus that releases a protective sheet affixed to an adherend upon application of a release force to the protective sheet via a release tape, the sheet release apparatus including conveyance means that is movable in a predetermined movement direction with the adherend held therein and bonding means for bonding the release tape to the protective sheet, in which the bonding means includes a plurality of stamp heads that each contact the release tape to press the release tape toward the protective sheet, a contact surface which contacts the release tape of each of the stamp heads is formed in a substantially circular shape.

This configuration makes it possible to more prevent the adherend from greatly springing up to follow the protective sheet when the release tape is released from the protective sheet because an adhesive force between the release tape and the protective sheet is reduced by the plurality of stamp heads each bonding the release tape to the protective sheet at respective positions spaced apart from one another than when the adhesive force between the release tape and the protective sheet excessively increases by bonding the release tape and the protective sheet to each other over an entire lower surface of the bonding means.

Further, when the plurality of stamp heads each bond the release tape to the protective sheet at the respective positions spaced apart from one another, a tension to be exerted on the protective sheet by the release tape is above the adhesive force between the release tape and the protective sheet. Even when a portion of the release tape comes off the protective sheet, a state where the release tape is firmly bonded to the protective sheet is maintained in the other portion of the release tape, thereby making it possible to prevent the entire release tape from being released from the protective sheet.

Advantageous Effect of Invention

The present invention makes it possible to stably release a protective sheet from an adherend without damaging the adherend.

DESCRIPTION OF EMBODIMENT

Figure 1:
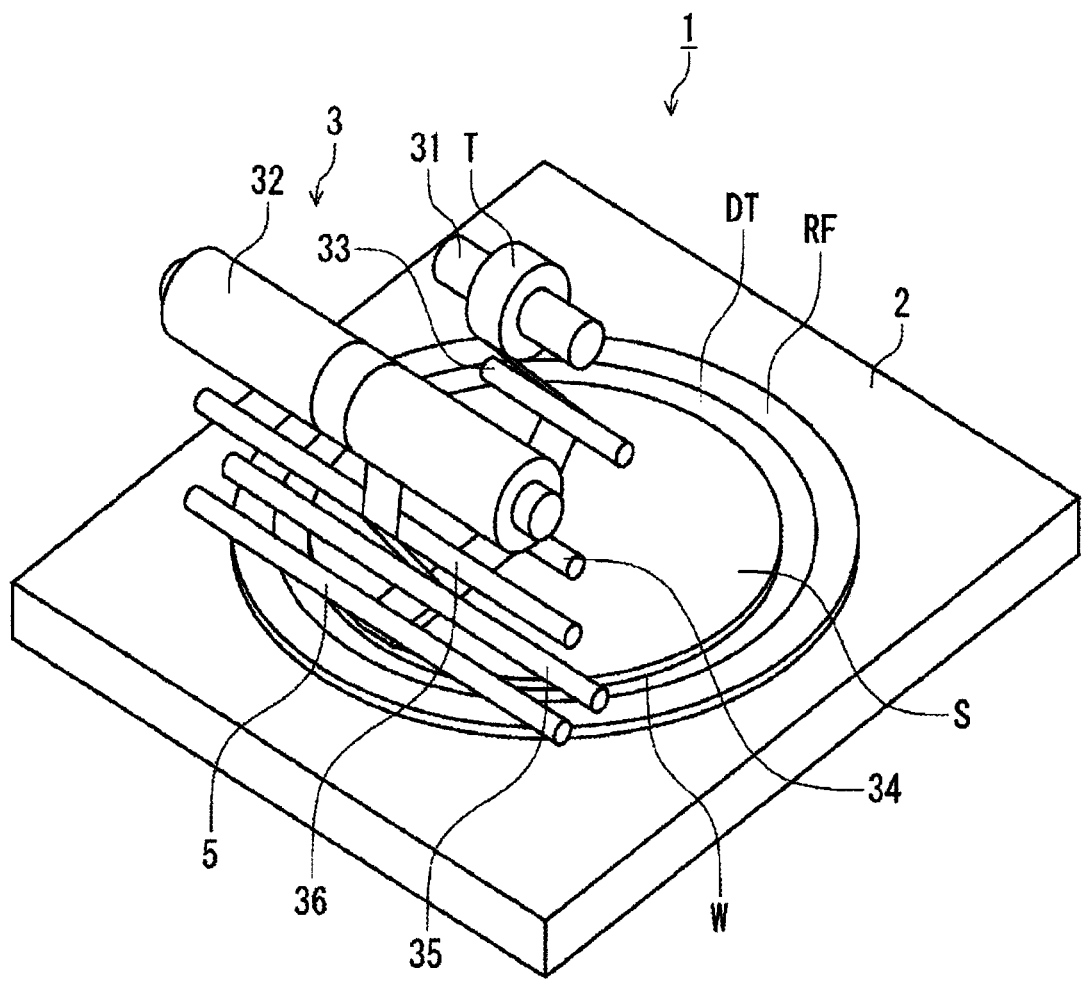
FIG. 1 is a perspective view illustrating a sheet release apparatus according to an embodiment of the present invention.

An embodiment of the present invention will be described with reference to the drawings. Hereinafter, when reference is made to the number of components or a numerical value, amount, range, or the like of each of the components, the number or the like is not limited to a particular number but may be the particular number or more or the particular number or less unless otherwise stated or except when expressly limited to the particular number in principle.

When reference is made to a shape of each of components or a positional relationship among the components, a substantially approximate or similar shape or the like is included unless otherwise stated or except when considered to be expressly excluded in principle.

In the drawings, characteristic portions may be exaggerated by being enlarged, for example, in order to facilitate the understanding of features, and a dimension ratio or the like of each of components is not necessarily the same as an actual one.

Figure 2:
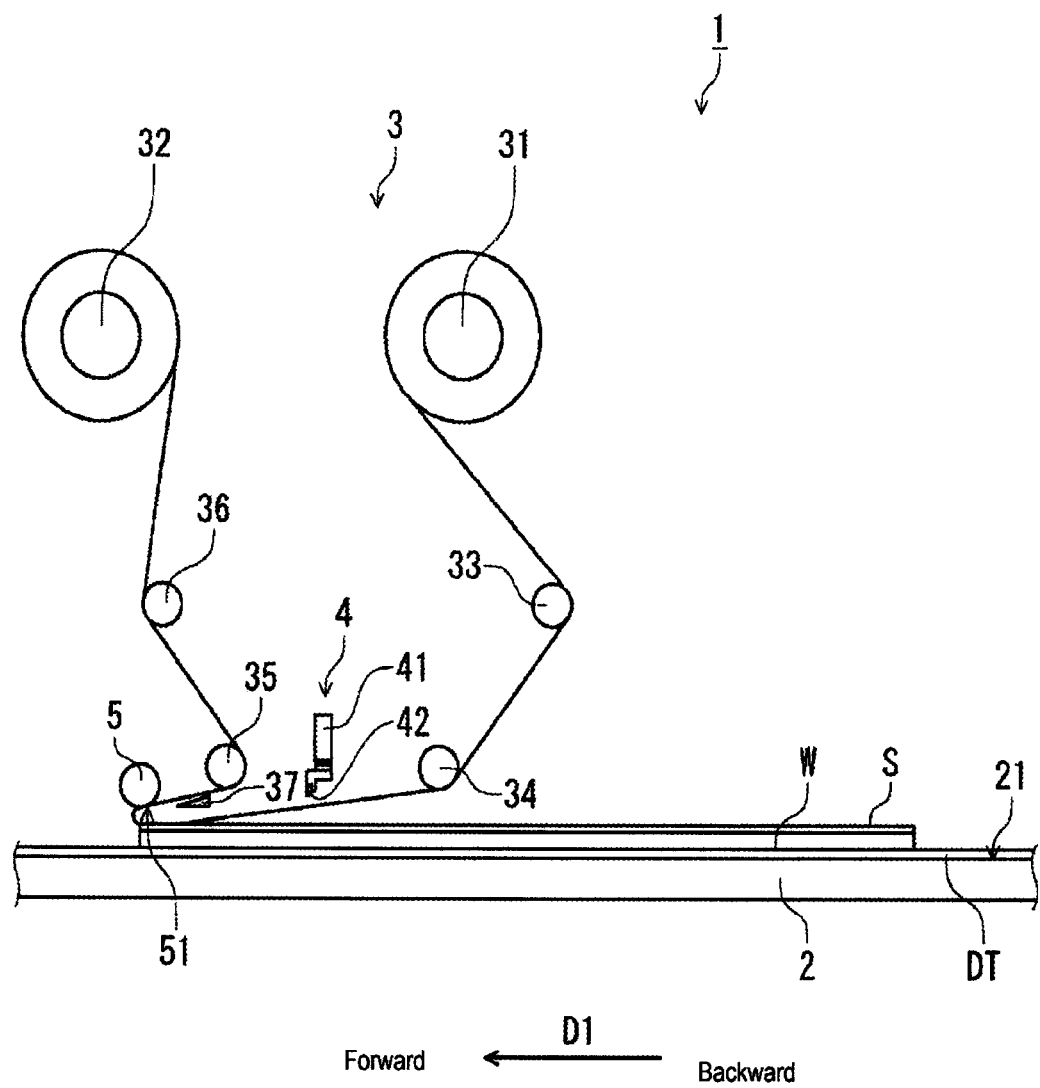
FIG. 2 is a side view of the sheet release apparatus.

FIG. 1 is a perspective view of a sheet release apparatus 1. FIG. 2 is a side view of the sheet release apparatus 1. The sheet release apparatus 1 releases a protective sheet S (a BG tape) affixed to protect a front surface of an adherend W in grinding a rear surface of the adherend W. The adherend W is a semiconductor substrate such as a silicon wafer, for example, but is not limited to this.

The adherend W is one mounted on a ring frame RF via a dicing tape DT with the protective sheet S on its upper surface side. The dicing tape DT is a ultraviolet curable tape, for example.

The sheet release apparatus 1 includes a conveyance table 2 on which the adherend W is mounted. The conveyance table 2 has a suction surface 21 provided on its upper surface side.

The suction surface 21 is connected to a vacuum source or a compressed air source not illustrated. When the vacuum source is started, the adherend W placed on the suction surface 21 is sucked and held on the suction surface 21. When the compressed air source is started, suction between the adherend W and the suction surface 21 is released.

The conveyance table 2 is provided to be movable in a movement direction D1 via movement means not illustrated. A movement speed of the conveyance table 2 is arbitrarily changeable. To shorten a time period required to release the protective sheet S without damaging the adherend W, for example, the movement speed may be made low in early stages of the release of the protective sheet S and may be made high after the release of the protective sheet S has progressed to some extent.

The sheet release apparatus 1 includes feeding means 3 capable of feeding a strip-shaped release tape T. The feeding means 3 includes a feeding roller 31, a winding roller 32, first to fourth guide rollers 33 to 36, and a knife edge 37.

The feeding roller 31 feedably supports the strip-shaped release tape T. The winding roller 32 winds the release tape T upon application of a feeding force thereto. The first to fourth guide rollers 33 to 36 and the knife edge 37 are respectively arranged at appropriate positions to exert a tension to the release tape T and regulate a track of the release tape T.

Figure 3A:
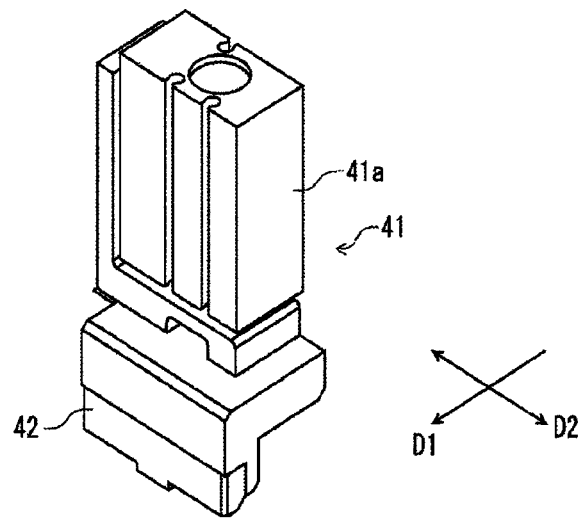
FIG. 3($a$) is a perspective view illustrating affixing means including a cylinder in a most retracted state, and FIG. 3($b$) is a perspective view illustrating affixing means including a cylinder in a most extended state.
Figure 3B:
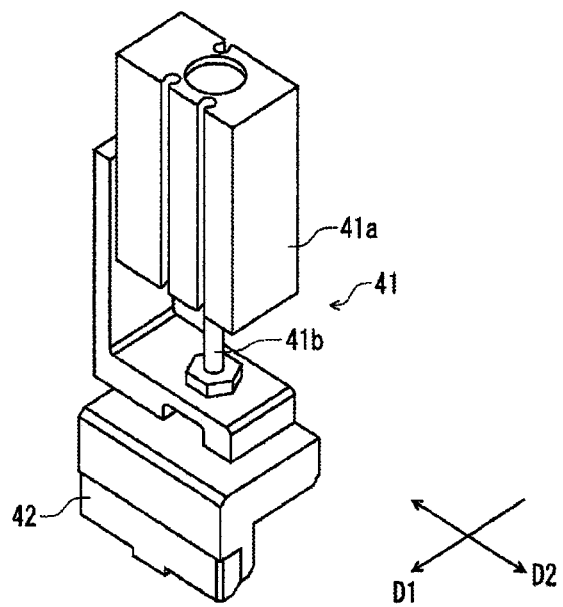

The sheet release apparatus 1 includes affixing means 4 for affixing the release tape T to the protective sheet S. The affixing means 4 includes an actuator 41 and a heat stamp 42 as bonding means, as illustrated in FIGS. 3(a) and 3(b).

The actuator 41 is an air cylinder to be driven with compressed air, for example. The actuator 41 includes a frame 41a and a rod 41b that has the heat stamp 42 provided at its lower end and is movable to advance and retreat to and from the frame 41a.

Figure 4A:
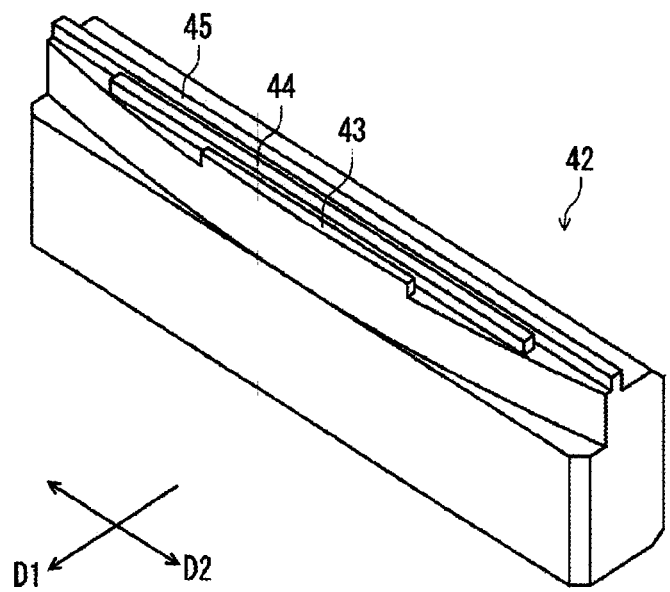
FIG. 4($a$) is a perspective view illustrating a heat stamp, and FIG. 4($b$) is a bottom view illustrating the heat stamp.
Figure 4B:
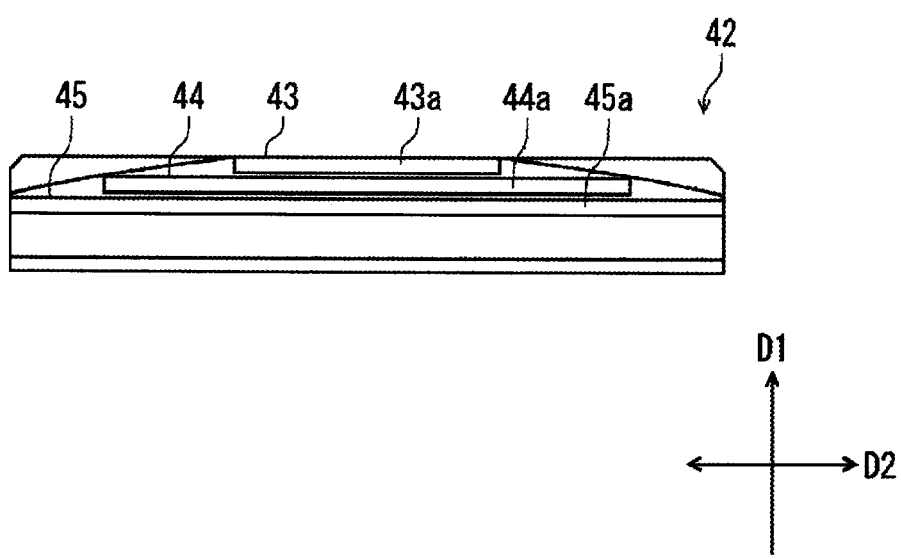

As illustrated in FIGS. 4(a) and 4(b), stamp heads 43, 44, and 45 are formed on a lower surface of the heat stamp 42. The stamp heads 43, 44, and 45 are pressed against the release tape T with they being raised to a predetermined temperature, to weld the release tape T and the protective sheet S to each other. That is, the heat stamp 42 does not contact the release tape T in an entire area of projection on the release tape T but contacts the release tape T only on respective lower surfaces (contact surfaces 43a, 44a, and 45a) of the stamp heads 43, 44, and 45.

The stamp heads 43, 44, and 45 are provided slightly apart from one another in this order toward the rear from the front in the movement direction D1. The contact surfaces 43a, 44a, and 45a are respectively formed in substantially rectangular shapes in which their short sides are parallel to the movement direction D1 and their long sides are along a width direction D2 perpendicular to the movement direction D1 as viewed from below. The respective widths of the stamp heads 43, 44, and 45 are set to be substantially the same. The respective lengths of the stamp heads 43, 44, and 45 are set to increase in this order. That is, the respective areas of the contact surfaces 43a, 44a, 45a increase in this order.

The stamp heads 43, 44, and 45 are not respectively limited to those provided in the single heat stamp 42, but may be respectively provided in a plurality of heat stamps. The number of stamp heads that each weld the release tape T and the protective sheet S to each other may be two or four or more. It is needless to say that respective shapes of the contact surfaces 43a, 44a, and 45a are not limited to those described above. The stamp heads 43, 44, and 45 are not limited to those continuous in the width direction D2, but may be arranged apart from one another in the width direction D2.

The sheet release apparatus 1 includes a regulation roller 5 as regulation means. The length of the regulation roller 5 is set larger than the diameter of the adherend W. The regulation roller 5 is arranged substantially above and approximately 2 to 3 mm apart from a position where the protective sheet S starts to be released (a release start position). The regulation roller 5 is provided to be rotatable around a not-illustrated support shaft substantially horizontally attached thereto such that the release tape T can be smoothly fed.

A surface (a guide surface 51) of the regulation roller 5 is preferably coated with fluorine resin or knurled, for example, such that the release tape T does not accidentally adhere thereto. This makes it possible to smoothly feed the release tape T.

The regulation means is not limited to a form described above, but may be one that regulates a deflection direction to press deflection of the release tape T using a fan-shaped column having a slippery and circular arc-shaped guide surface, for example.

The regulation means may be configured not to be rotatable around its support shaft and to slide the release tape T on the guide surface 51 if the guide surface 51 is slippery and the regulation means can smoothly feed the release tape T.

Then, an operation of the sheet release apparatus 1 will be described with reference to the drawings. FIG. 5 is a diagram illustrating a procedure for releasing a protective sheet S.

Figure 5A:
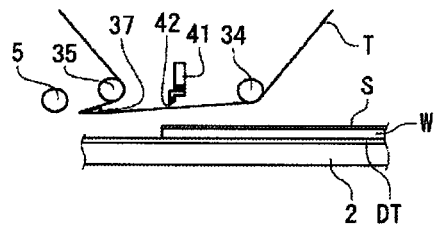
FIGS. 5($a$)-($f$) are schematic views illustrating a procedure for releasing a protective sheet.

First, after an adherend W having a thickness of approximately 20 μm and having a diameter of approximately 400 mm is sucked to the conveyance table 2, the conveyance table 2 is moved such that an outer peripheral portion of the adherend W is arranged below the heat stamp 42, as illustrated in FIG. 5(a).

Figure 5B:
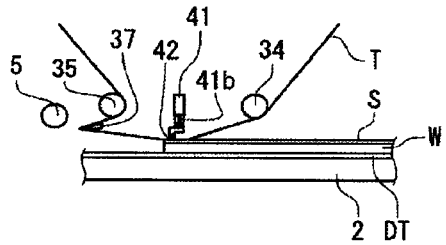

Then, as illustrated in FIG. 5(b), when the rod 41b fully extends to lower the heat stamp 42, and the stamp heads 43, 44, and 45 contact a release tape T to heat and press the release tape T at a stamp temperature of 180° C., whereby the release tape T and the protective sheet S are welded to each other on each of the contact surfaces 43a, 44a, and 45a. A welding range of the release tape T and the protective sheet S is set depending on each of the respective shapes of the contact surfaces 43a, 44a, and 45a. That is, the welding range by the stamp head 43 is smaller than the welding range by the stamp head 44, and the welding range by the stamp head 44 is smaller than the welding range by the stamp head 45.

Figure 5C:
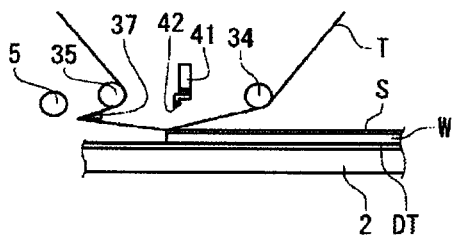
Figure 5D:
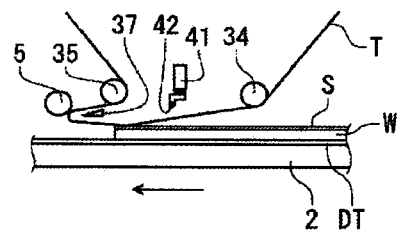

Then, after the rod 41b fully contracts to raise the heat stamp 42, as illustrated in FIG. 5(c), the conveyance table 2 is moved to bring a release start position closer to the regulation roller 5 (toward the left side of the paper of FIG. 5(d)), as illustrated in FIG. 5(d). The release tape T is deflected in a lateral and substantially U shape as viewed from its side surface that expands toward the front in a direction of progress of the conveyance table 2 from the release start position.

Figure 5E:
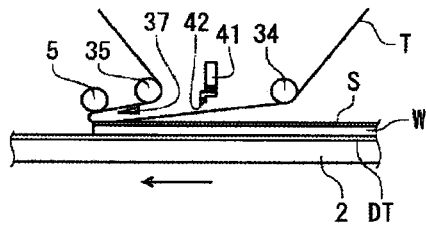

Then, as illustrated in FIG. 5(e), when the conveyance table 2 is further moved, the regulation roller 5 contacts the release tape T, and the regulation roller 5 presses the deflection of the release tape T in a substantially vertical direction, in other words, such that an angle formed between the release tape T and the protective sheet S decreases.

Figure 5F:
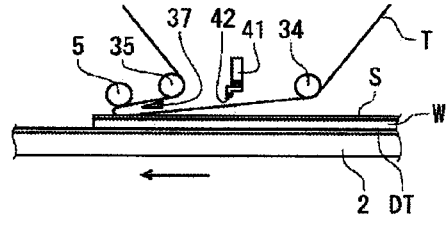

Then, as illustrated in FIG. 5(f), when the conveyance table 2 is further moved, a release force for releasing the protective sheet S from the adherend W is exerted on the protective sheet S with the deflection of the release tape T pressed in the substantially vertical direction by a tension to be exerted on the release tape T. A movement speed of the conveyance table 2 when the protective sheet S starts to be released is set to one millimeter per second, for example.

When the conveyance table 2 further moves, the protective sheet S starts to be released from the adherend W. Specifically, immediately before an outer peripheral portion of the protective sheet S is first released from the adherend W, the release tape T is pressed downward by contacting the regulation roller 5. Accordingly, the release tape T is deflected with the angle formed between the release tape T and the protective sheet S being small.

Then, when the conveyance table 2 moves, the protective sheet S is released from the adherend W. The protective sheet S starts to be released from a position, to which the release tape T is welded by the stamp head 43, of the protective sheet S. Then, as the conveyance table 2 moves, the protective sheet S is gradually released from the adherend W.

When a tension to be exerted on the protective sheet S by the release tape T is above an adhesive force between the release tape T and the protective sheet S, the release tape T may come off the protective sheet S.

For example, in a region where the release tape T and the protective sheet S are welded to each other in a small area by the stamp head 43, the adhesive force between the release tape T and the protective sheet S is relatively small, and a tension per unit area to be exerted on the protective sheet S by the release tape T tends to be large. Accordingly, the release tape T may come off the protective sheet S.

However, the stamp heads 44 and 45 positioned behind the stamp head 43 in the movement direction D1 each weld the release tape T and the protective sheet S to each other in a wider area, whereby the tension per unit area to be exerted on the protective sheet S by the release tape T decreases. Accordingly, a state where the release tape T and the protective sheet S are welded to each other can be maintained in a region where they are welded to each other by each of the stamp heads 44 and 45.

Further, a range where the release tape T and the protective sheet S are welded to each other is limited to the contact surfaces 43a, 44a, and 45a in an area of projection of the heat stamp 42 on the release tape T, thereby making it possible to prevent the thin adherend W from being cracked to spring up due to the release tape T being excessively pressed and cured in a wide range.

As illustrated in FIG. 5(f), after the protective sheet S in the outer peripheral portion of the adherend W is completely released, the conveyance table 2 is further moved, to release an entire surface of the protective sheet S from the adherend W.

Thus, the sheet release apparatus 1 according to the present embodiment is a sheet release apparatus 1 that releases a protective sheet S affixed to an adherend W upon application of a release force to the protective sheet S via a release tape T, the sheet release apparatus 1 including a conveyance table 2 that is movable in a predetermined movement direction D1 with the adherend W held therein and a heat stamp 42 that welds the release tape T to the protective sheet S, the heat stamp 42 including a plurality of stamp heads 43, 44, and 45 that each contact the release tape T to press the release tape T toward the protective sheet S.

This configuration makes it possible to more prevent the adherend W from greatly springing up to follow the protective sheet S when the release tape T is released from the protective sheet S because an adhesive force between the release tape T and the protective sheet S is reduced by the plurality of stamp heads 43, 44, and 45 each welding the release tape T to the protective sheet S at respective positions spaced apart from one another than when the adhesive force between the release tape T and the protective sheet S excessively increases by welding the release tape T and the protective sheet S to each other over an entire lower surface of the heat stamp 42.

Further, when the plurality of stamp heads 43, 44, and 45 each weld the release tape T to the protective sheet S at the respective positions spaced apart from one another, a tension to be exerted on the protective sheet S by the release tape T is above the adhesive force between the release tape T and the protective sheet S. Even when a portion of the release tape T comes off the protective sheet S, a state where the release tape T is firmly welded to the protective sheet S is maintained in the other portion of the release tape T, thereby making it possible to prevent the entire release tape T from being released from the protective sheet S.

The sheet release apparatus 1 according to the present embodiment is configured such that the stamp heads 43, 44, and 45 are provided apart from one another in the movement direction D1.

According to this configuration, even when the release tape T comes off the protective sheet S in a portion positioned at the front of the release tape T in the movement direction D1, a state where the release tape T is firmly welded to the protective sheet S is maintained in a portion positioned at the rear of the release tape T in the movement direction D1. Accordingly, the protective sheet S can be reliably released from the adherend W as the conveyance table 2 moves.

The bonding means is not limited to the heat stamp 42, but may be any one if it can bond the release tape T to the protective sheet S. The heat stamp 42 is not limited to a configuration including the above-described stamp heads 43, 44, and 45 having a substantially rectangular shape as viewed from below.

Figure 6A:
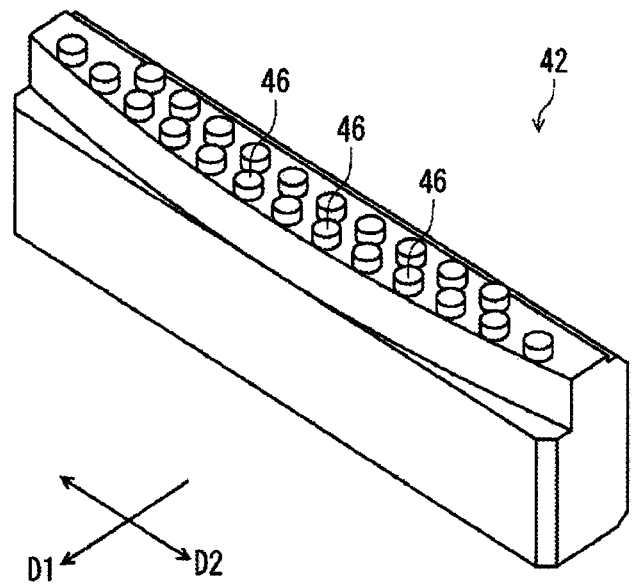
FIGS. 6($a$) and 6($b$) are diagrams illustrating a heat stamp in a sheet release apparatus according to a first modification to the present invention, where FIG. 6($a$) is a perspective view and FIG. 6($b$) is a bottom view.
Figure 6B:
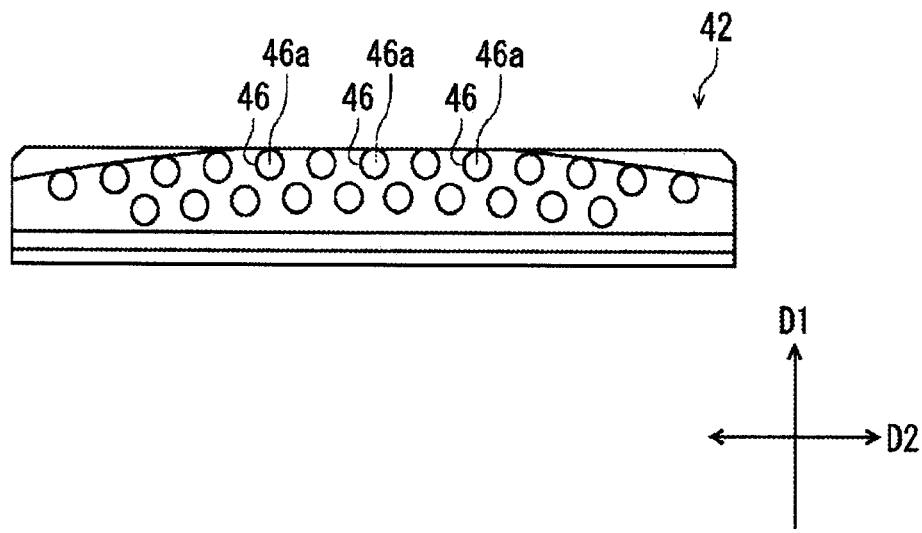

For example, the heat stamp 42 may be a heat stamp 42 having a plurality of stamp heads 46 provided on its lower surface, as illustrated in FIGS. 6(a) and 6(b). The stamp heads 46 are pressed against a release tape T with they being raised to a predetermined temperature, to weld the release tape T and a protective sheet S to each other.

The plurality of stamp heads 46 are arranged apart from one another in a movement direction D1 and a width direction D2. A lower surface (a contact surface 46*a*) of each of the stamp heads 46 is formed in a substantially circular shape as viewed from below. Therefore, the contact surface 46*a* is formed to gradually increase in width toward the rear from its front end in the movement direction D1.

The stamp head 46 arranged on the outermost periphery among the stand heads 46 is arranged to oppose a peripheral edge of the adherend W. Although the contact surfaces 46*a* are respectively set to have substantially the same areas in FIG. 6(*b*), the contact surfaces 46*a* may be formed to gradually increase toward the rear from the front in the movement direction D1.

Thus, a sheet release apparatus 1 according to a first modification to the present invention is a sheet release apparatus 1 that releases a protective sheet S affixed to an adherend W upon application of a release force to the protective sheet S via a release tape T, the sheet release apparatus 1 including a conveyance table 2 that is movable in a predetermined movement direction D1 with the adherend W held therein and a heat stamp 42 that welds the release tape T to the protective sheet S, the heat stamp 42 including a plurality of stamp heads 46 that each contact the release tape T to press the release tape T toward the protective sheet S.

This configuration makes it possible to more prevent the adherend W from greatly springing up to follow the protective sheet S when the release tape T is released from the protective sheet S because an adhesive force between the release tape T and the protective sheet S is reduced by the plurality of stamp heads 46 each welding the release tape T to the protective sheet S at respective positions spaced apart from one another than when the adhesive force between the release tape T and the protective sheet S excessively increases by welding the release tape T and the protective sheet S to each other over an entire lower surface of the heat stamp 42.

Further, the plurality of stamp heads 46 each weld the release tape T to the protective sheet S at the respective positions spaced apart from one another, whereby a tension to be exerted on the protective sheet S by the release tape T is above the adhesive force between the release tape T and the protective sheet S. Even when a portion of the release tape T comes off the protective sheet S, a state where the release tape T is firmly welded to the protective sheet S is maintained in the other portion of the release tape T, thereby making it possible to prevent the entire release tape T from being released from the protective sheet S.

The sheet release apparatus 1 according to the present embodiment is configured such that the stamp heads 46 are provided apart from one another in the movement direction D1.

According to this configuration, even when the release tape T comes off the protective sheet S in a portion positioned at the front of the release tape T in the movement direction D1, a state where the release tape T is firmly welded to the protective sheet S is maintained in a portion positioned at the rear of the release tape T in the movement direction D1. Accordingly, the protective sheet S can be reliably released from the adherend W as the conveyance table 2 moves.

The sheet release apparatus 1 according to the present embodiment is configured such that the stamp heads 46 are provided apart from one another in the width direction D2.

This configuration makes it possible to more prevent the adherend W from greatly springing up to follow the protective sheet S when the release tape T is released from the protective sheet S because an adhesive force between the release tape T and the protective sheet S is reduced by the plurality of stamp heads 46 each welding the release tape T to the protective sheet S at respective positions spaced apart from one another in the width direction D2 than when the adhesive force between the release tape T and the protective sheet S excessively increases by welding the release tape T and the protective sheet S to each other over an entire lower surface of the heat stamp 42.

The sheet release apparatus 1 according to the present embodiment is configured such that the stamp head 46 arranged on the outermost periphery among the stand heads 46 is arranged along a peripheral edge of the protective sheet S.

According to this configuration, the protective sheet S starts to be released from the adherend W on the contact surface 46*a* of the stamp head 46 arranged along the peripheral edge of the protective sheet S, whereby the release tape T can start to be released from the protective sheet S without offset.

The sheet release apparatus 1 according to the present embodiment is configured such that the contact surfaces 46*a* of the plurality of stamp heads 46 are respectively set to have substantially the same areas.

According to this configuration, the stamp heads 46 each weld the release tape T to the protective sheet S in substantially the same areas, whereby the entire release tape T can be released from the protective sheet S without offset.

The sheet release apparatus 1 according to the present embodiment is configured such that the contact surface 46*a* of the stamp head 46 arranged at a front end in the movement direction D1 among the plurality of stamp heads 46 is formed to gradually increase in width toward the rear from the front in the movement direction D1.

According to this configuration, a release force is concentrated at a front end of the contact surface 46*a* in the movement direction D1 so that the protective sheet S starts to be released from the adherend W, and the protective sheet S is then released from the adherend W over a wide range toward the rear of the contact surface 46*a* in the movement direction D1, thereby making it possible to reliably release the entire release tape T from the protective sheet S.

Figure 7A:
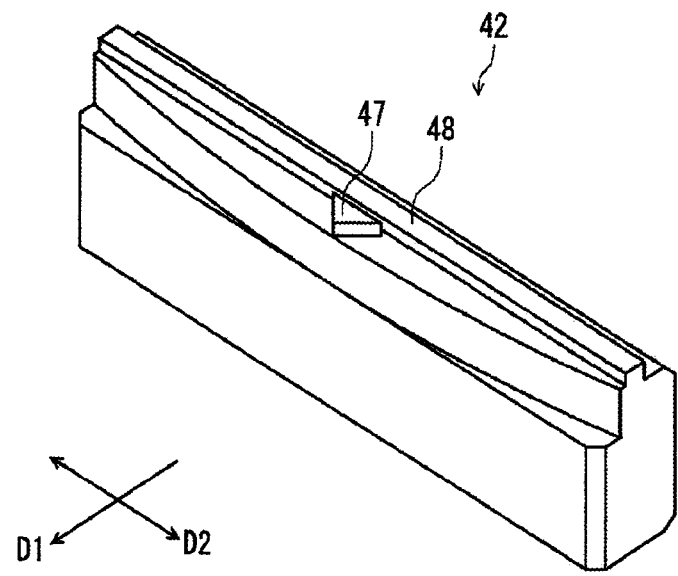
FIGS. 7($a$) and 7($b$) are diagrams illustrating a heat stamp in a sheet release apparatus according to a second modification to the present invention, where FIG. 7($a$) is a perspective view and FIG. 7($b$) is a bottom view.
Figure 7B:
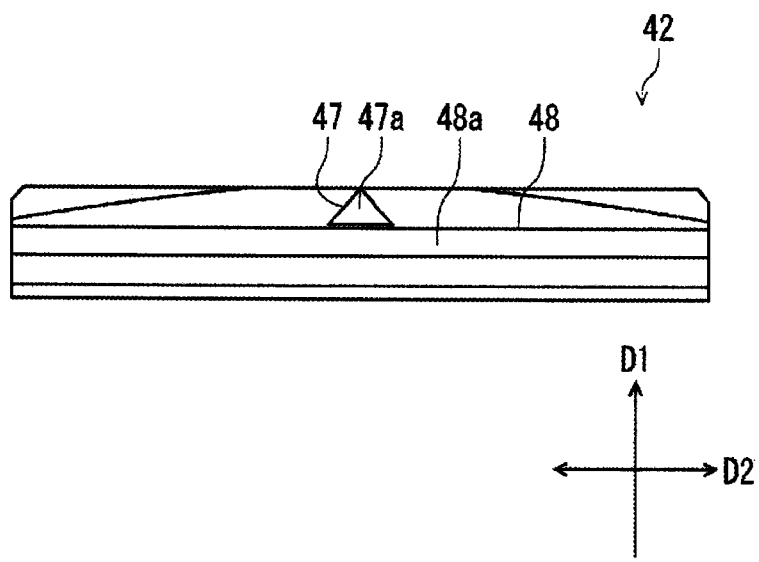

For example, the heat stamp 42 may be a heat stamp 42 having stamp heads 47 and 48 provided on its lower surface, as illustrated in FIGS. 7(*a*) and 7(*b*). The stamp heads 47 and 48 are pressed against a release tape T with they being raised to a predetermined temperature, to weld the release tape T and a protective sheet S to each other.

The stamp heads 47 and 48 are arranged apart from each other in a movement direction D1. A lower surface (a contact surface 47*a*) of the stamp head 47 is formed in a substantially triangular shape as viewed from below. The contact surface 47*a* is formed to gradually increase in width toward the rear from its front end in the movement direction D1.

A lower surface (a contact surface 48*a*) of the stamp head 48 is formed in a substantially rectangular shape in which its short side is parallel to the movement direction D1 and its long side is along a width direction D2 perpendicular to the movement direction D1 as viewed from below. The contact surface 48*a* is formed to be wider than the contact surface 47*a*. Respective shapes of the contact surfaces 47*a* and 48*a* are not limited to those described above. The stamp heads 47 and 48 are not limited to those continuous in the width direction D2, but may be arranged apart from each other in the width direction D2.

Thus, a sheet release apparatus 1 according to a second modification to the present invention is a sheet release apparatus 1 that releases a protective sheet S affixed to an adherend W upon application of a release force to the protective sheet S via a release tape T, the sheet release apparatus 1 including a conveyance table 2 that is movable in a predetermined movement direction D1 with the adherend W held therein and a heat stamp 42 that welds the release tape T to the protective sheet S, the heat stamp 42 including a plurality of stamp heads 47 and 48 that each contact the release tape T to press the release tape T toward the protective sheet S.

This configuration makes it possible to more prevent the adherend W from greatly springing up to follow the protective sheet S when the release tape T is released from the protective sheet S because an adhesive force between the release tape T and the protective sheet S is reduced by the plurality of stamp heads 47 and 48 each welding the release tape T to the protective sheet S at respective positions spaced apart from each other than when the adhesive force between the release tape T and the protective sheet S excessively increases by welding the release tape T and the protective sheet S to each other over an entire lower surface of the heat stamp 42.

Further, the plurality of stamp heads 47 and 48 each weld the release tape T to the protective sheet S at the respective positions spaced apart from each other, whereby a tension to be exerted on the protective sheet S by the release tape T is above the adhesive force between the release tape T and the protective sheet S. Even when a portion of the release tape T comes off the protective sheet S, a state where the release tape T is firmly welded to the protective sheet S is maintained in the other portion of the release tape T, thereby making it possible to prevent the entire release tape T from being released from the protective sheet S.

The sheet release apparatus 1 according to the present embodiment is configured such that the stamp heads 47 and 48 are provided apart from each other in the movement direction D1.

According to this configuration, even when the release tape T comes off the protective sheet S in a portion positioned at the front of the release tape T in the movement direction D1, a state where the release tape T is firmly welded to the protective sheet S is maintained in a portion positioned at the rear of the release tape T in the movement direction D1. Accordingly, the protective sheet S can be reliably released from the adherend W as the conveyance table 2 moves.

The sheet release apparatus 1 according to the present embodiment is configured such that the contact surface 47a of the stamp head 47 arranged at a front end in the movement direction D1 is formed to gradually increase in width toward the rear from the front in the movement direction D1.

According to this configuration, a release force is concentrated at a front end of the contact surface 46a in the movement direction D1 so that the protective sheet S starts to be released from the adherend W, and the protective sheet S is then released from the adherend W over a wide range toward the rear of the contact surface 46a in the movement direction D1, thereby making it possible to reliably release the entire release tape T from the protective sheet S.

It should be understood that various modifications can be made in addition to the foregoing without departing from the spirit of the present invention and the present invention covers the modifications. The above-described embodiment and modifications may be combined with each other.

REFERENCE SIGNS LIST

1 . . . sheet release apparatus
2 . . . conveyance table (conveyance means)
21 . . . suction surface
3 . . . feeding means
31 . . . feeding roller
32 . . . winding roller
37 . . . knife edge
4 . . . affixing means
41 . . . actuator
42 . . . heat stamp (bonding means)
43~48 . . . stamp head
5 . . . regulation roller
51 . . . guide surface
DT . . . dicing tape
RF . . . ring frame
S . . . protective sheet
T . . . release tape
W . . . adherend

What is claimed is:

1. A sheet release apparatus that releases a protective sheet affixed to an adherend upon application of a release force to the protective sheet via a release tape, the sheet release apparatus comprising:
    conveyance means that is movable in a predetermined movement direction with the adherend held therein; and
    bonding means for bonding the release tape to the protective sheet,
    wherein the bonding means comprises a plurality of stamp heads that each contact the release tape to press the release tape toward the protective sheet,
    a contact surface which contacts the release tape of each of the stamp heads is formed in a substantially circular shape.

2. The sheet release apparatus according to claim 1, wherein the plurality of stamp heads are provided apart from one another in the movement direction.

3. The sheet release apparatus according to claim 2, wherein the plurality of stamp heads are provided apart from one another in a width direction perpendicular to the movement direction.

4. The sheet release apparatus according to claim 2, wherein, wherein a contact surface, which contacts the release tape, of the stamp head arranged at a front end in the movement direction among the plurality of stamp heads is formed to gradually increase in width toward the rear from the front in the movement direction.

5. The sheet release apparatus according to claim 1, wherein the plurality of stamp heads are provided apart from one another in a width direction perpendicular to the movement direction.

6. The sheet release apparatus according to claim 5, wherein the plurality of stamp heads are arranged along a peripheral edge of the protective sheet.

7. The sheet release apparatus according to claim 5, wherein, wherein a contact surface, which contacts the release tape, of the stamp head arranged at a front end in the movement direction among the plurality of stamp heads is formed to gradually increase in width toward the rear from the front in the movement direction.

8. The sheet release apparatus according to claim 6, wherein contact surfaces, which contact the release tape, of the stamp heads are respectively set to substantially the same areas.

9. The sheet release apparatus according to claim 8, wherein, wherein a contact surface, which contacts the release tape, of the stamp head arranged at a front end in the movement direction among the plurality of stamp heads is formed to gradually increase in width toward the rear from the front in the movement direction.

10. The sheet release apparatus according to claim 6, wherein, wherein a contact surface, which contacts the release tape, of the stamp head arranged at a front end in the movement direction among the plurality of stamp heads is formed to gradually increase in width toward the rear from the front in the movement direction.

11. The sheet release apparatus 1 according to claim 1, wherein a contact surface, which contacts the release tape, of the stamp head arranged at a front end in the movement direction among the plurality of stamp heads is formed to gradually increase in width toward the rear from the front in the movement direction.

12. A sheet release apparatus for releasing a protective sheet affixed to an adherend upon application of a release force to the protective sheet with a release tape, the sheet release apparatus comprising:
   a conveyance table, said conveyance table movable in a movement direction with the adherend held therein; and
   an actuator having a stamp positioned adjacent the release tape with the protective sheet between the release tape and the adherent, the actuator configured to bond the release tape to the protective sheet,
   whereby the stamp contacts the release tape to press the release tape toward the protective sheet bonding the release tape to the protective sheet.

13. The sheet release apparatus as in claim 12 wherein:
   the stamp has a contact surface that increases in width from a front end in the movement direction of said conveyance table.

14. The sheet release apparatus as in claim 12 wherein:
   the stamp comprises a heat stamp having a plurality of stamp heads.

15. The sheet release apparatus as in claim 14 wherein:
   each of the plurality of stamp heads have a circular shape.

* * * * *